United States Patent
Arakawa

(10) Patent No.: US 10,724,134 B2
(45) Date of Patent: Jul. 28, 2020

(54) MAGNETIC MATERIAL SPUTTERING TARGET AND METHOD FOR PRODUCING SAME

(71) Applicant: JX Nippon Mining & Metals Corporation, Tokyo (JP)

(72) Inventor: Atsutoshi Arakawa, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 280 days.

(21) Appl. No.: 15/033,288

(22) PCT Filed: Nov. 20, 2014

(86) PCT No.: PCT/JP2014/080708
§ 371 (c)(1),
(2) Date: Apr. 29, 2016

(87) PCT Pub. No.: WO2015/080009
PCT Pub. Date: Jun. 4, 2015

(65) Prior Publication Data
US 2016/0237552 A1   Aug. 18, 2016

(30) Foreign Application Priority Data
Nov. 28, 2013  (JP) .................................. 2013-246400

(51) Int. Cl.
*C23C 14/34* (2006.01)
*C22C 19/07* (2006.01)
(Continued)

(52) U.S. Cl.
CPC .......... *C23C 14/3414* (2013.01); *B22F 3/10* (2013.01); *C22C 1/0433* (2013.01); *C22C 19/07* (2013.01);
(Continued)

(58) Field of Classification Search
CPC ... C23C 14/067; C23C 14/14; C23C 14/3414; H01J 37/3255
See application file for complete search history.

(56) References Cited

U.S. PATENT DOCUMENTS 7,141,208 B2   11/2006  Ueno et al.
7,927,434 B2    4/2011  Nakamura et al.
(Continued)

FOREIGN PATENT DOCUMENTS

JP   2004-346423 A   12/2004
JP   2007-297679 A   11/2007
(Continued)

*Primary Examiner* — Jason Berman
(74) *Attorney, Agent, or Firm* — Howson & Howson LLP

(57) ABSTRACT

Provided is a magnetic material sputtering target produced from a sintered compact having a B content of 17 at % or more and 40 at % or less, and remainder being one or more elements selected from Co and Fe, wherein the target includes a B-rich phase and a B-poor phase, and a number of the B-rich phases in which a maximum inscribed circle having a diameter of 15 µm or more can be drawn is one or less. The B-rich phase is finely dispersed in the magnetic material sputtering target of the present invention, and the machinability of the target is consequently improved. Moreover, significant effects are yielded in that the generation of particles is inhibited and the yield in the production of thin films is improved when the target is used for sputtering with a magnetron sputtering equipment comprising a DC power supply.

16 Claims, 1 Drawing Sheet

Example of maximum inscribed circle drawn in B-rich phase

20 µm

(51) Int. Cl.
  *C22C 33/02* (2006.01)
  *C22C 38/00* (2006.01)
  *C22C 38/10* (2006.01)
  *H01F 41/18* (2006.01)
  *C22C 1/04* (2006.01)
  *H01L 43/12* (2006.01)
  *H01J 37/34* (2006.01)
  *H01L 43/10* (2006.01)
  *B22F 3/10* (2006.01)
  *H01J 37/32* (2006.01)
  *C23C 14/14* (2006.01)
  *C22C 30/00* (2006.01)

(52) U.S. Cl.
  CPC ............ *C22C 33/02* (2013.01); *C22C 38/002* (2013.01); *C22C 38/10* (2013.01); *C23C 14/14* (2013.01); *H01F 41/183* (2013.01); *H01J 37/3255* (2013.01); *H01J 37/3426* (2013.01); *H01J 37/3429* (2013.01); *H01L 43/10* (2013.01); *H01L 43/12* (2013.01); *C22C 30/00* (2013.01); *C22C 2200/02* (2013.01)

(56) References Cited

U.S. PATENT DOCUMENTS

| | | | |
|---|---|---|---|
| 8,057,650 | B2 | 11/2011 | Hayashi et al. |
| 8,568,576 | B2 | 10/2013 | Sato |
| 8,932,444 | B2 | 1/2015 | Sato |
| 8,936,707 | B2 | 1/2015 | Sato |
| 9,034,153 | B2 | 5/2015 | Satoh |
| 9,269,389 | B2 | 2/2016 | Arakawa |
| 2005/0011308 | A1* | 1/2005 | Ueno |
| 2012/0241316 | A1* | 9/2012 | Arakawa |
| 2013/0206591 | A1 | 8/2013 | Takami et al. |
| 2013/0220804 | A1 | 8/2013 | Arakawa et al. |
| 2013/0341184 | A1 | 12/2013 | Morishita et al. |
| 2014/0001038 | A1 | 1/2014 | Ogino et al. |
| 2015/0021175 | A1 | 1/2015 | Arakawa et al. |
| 2015/0027882 | A1 | 1/2015 | Ogino et al. |
| 2015/0107411 | A1 | 4/2015 | Ogino |
| 2015/0213822 | A1 | 7/2015 | Ogino |

FOREIGN PATENT DOCUMENTS

JP    2008-127591 A    6/2008
WO    2013/133163 A1    9/2013

\* cited by examiner

[Fig. 1]
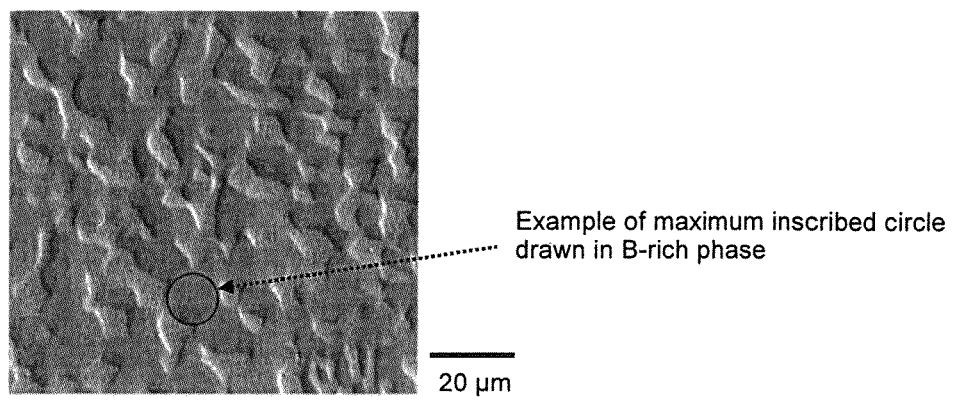
Example of maximum inscribed circle drawn in B-rich phase
20 μm
[Fig. 2]
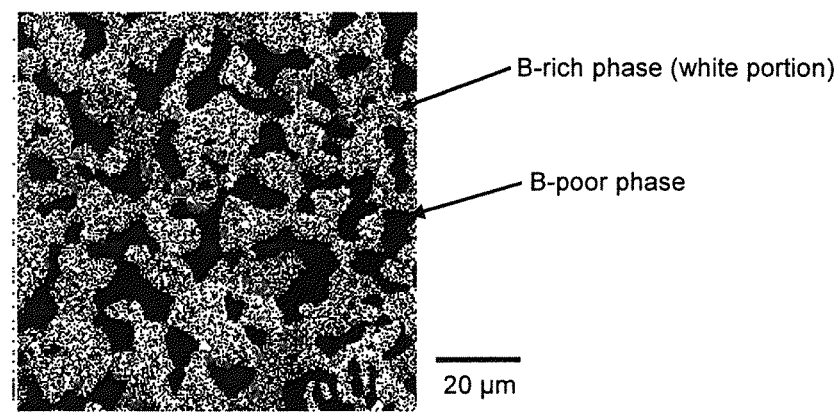
B-rich phase (white portion)
B-poor phase
20 μm

MAGNETIC MATERIAL SPUTTERING TARGET AND METHOD FOR PRODUCING SAME

TECHNICAL FIELD BACKGROUND

The present invention relates to a magnetic material sputtering target, which contains boron (B) and is produced based on a powder sintering method; and particularly relates to a magnetic material target, in which the boron (B)-rich phase in the target is finely dispersed, and which reduces the generation of particles during sputtering, and is free from problems of mechanical properties such as cracks and useful for depositing films used in magnetic heads, magnetic resistance elements (MRAM) and the like, as well as to the production method thereof.

A tunnel magnetic resistance film having a high magnetoresistance effect is being used in magnetic heads and MRAMs, and magnetic substances including boron (B) are being used in the material that is used in the layer configuring these films. For example, known are compositions based on Co, Fe and boron such as Co—B, Fe—B, and Fe—Co—B, or compositions in which Al, Cu, Mn, Ni and the like are added thereto.

Generally speaking, when the composition of a B-containing magnetic substance of the tunnel magnetic resistance film is, for instance, Fe—Co—B, such film is produced by sputtering a Fe—Co—B sputtering target.

Since this kind of magnetic material sputtering target contains a large amount of B, in particular when the B composition ratio exceeds 10% and becomes high, an extremely brittle Fe boride phase of $Fe_2B$ or FeB, or a Co boride phase is formed. Consequently, with a sputtering target produced based on the melting method, the ingot would crack or become fractured, and it was difficult to obtain a sputtering target from such an ingot.

There is a method for producing a predetermined sputtering target by strictly managing the production process (refer to Patent Document 1), and this method yields a major advantage in that gas components such as oxygen can be reduced, but the difficulty of the production process cannot be denied.

Here, while there are various types of sputtering equipment, in the deposition of the foregoing magnetic substance film, a magnetron sputtering equipment comprising a DC power supply is widely used due to its high productivity. The sputtering method is a method in which a substrate as a positive electrode and a target as a negative electrode are placed opposite each other, and a high voltage is applied between the substrate and the target in an inert gas atmosphere to generate an electric field.

Hereat, the inert gas becomes ionized to form plasma made from electrons and positive ions. When the positive ions in the plasma collide with the surface of the target (negative electrode), the atoms configuring the target are ejected, and the ejected atoms become adhered onto the facing substrate surface to form a film. The sputtering method uses the principle that, through a sequence of these operations, the material configuring the target is deposited as a film on the substrate.

In light of the above, several prior patents have been proposed. For example, Patent Document 2 proposes: an Fe—Co—B-based alloy target material, wherein the diameter of the maximum inscribed circle that can be drawn in an area with no boride phase in a cross-sectional micro structure is 30 μm or less; and the said Fe—Co—B-based alloy target material, wherein the composition formula based on atomic ratio is $(Fe_XCo_{100-X})_{100-Y}B_Y$, 5≤X≤95, 5≤Y≤30.

The object of Patent Document 2 is to realize low magnetic permeability of the Fe—Co—B-based alloy target material for depositing a soft-magnetic film that is used in a perpendicular magnetic recording medium or a TMR element, and to provide an Fe—Co—B-based alloy target material that yields favorable sputtering characteristics. Nevertheless, in the foregoing case, there are drawbacks in that Patent Document 2 is inferior in terms of refinement and dispersibility of the boride phase, and characteristics as a sintered compact target are insufficient.

Moreover, Patent Document 3 discloses a soft-magnetic FeCo-based target material in which the atomic ratio of Fe:Co is 10:90 to 70:30 in the FeCo-based alloy. Patent Document 3 additionally discloses a soft-magnetic magnetic FeCo target material containing Al and/or Cr in an amount of 0.2 to 5.0 at %. Patent Document 3 further proposes an FeCo soft-magnetic target material additionally containing one or more types of B, Nb, Zr, Ta, Hf, Ti, and V in an amount of 30 at % or less.

Nevertheless, in the foregoing case, while Patent Document 3 describes that the sintering method or the casting method may be applied, Patent Document 3 makes no reference to the problem of the boride phase, and does not offer any solution to solve such problem.
[Patent Document 1] WO 2011/070860
[Patent Document 2] JP 2004-346423 A
[Patent Document 3] JP 2008-121071 A

SUMMARY OF INVENTION

Technical Problem

Proposed herein is a magnetic material target, in which B-rich phase is finely dispersed in the matrix of the magnetic material sputtering target, of which the machinability is improved, and which can inhibit the generation of particles and improve the yield in the production of thin films when performing sputtering with a magnetron sputtering equipment comprising a DC power supply. In particular, an object of this invention is to provide a sputtering target that is useful for depositing films used in magnetic heads and MRAMs, as well as other magnetic films.

Based on the foregoing findings, the following invention is proposed:
1) A magnetic material sputtering target produced from a sintered compact having a B content of 17 at % or more and 40 at % or less, and remainder being one or more elements selected from Co and Fe, wherein the target includes a B-rich phase and a B-poor phase, and a number of the B-rich phases in which a maximum inscribed circle having a diameter of 15 μm or more can be drawn is one or less.
2) The magnetic material sputtering target according to 1) above, wherein the target contains one or more elements selected from Al, Cr, Cu, Hf, Mn, Ni, Ru, Si, Ta, and W in an amount of 0.5 at % or more and 20 at % or less.
3) The magnetic material sputtering target according to 1) or 2) above, wherein a density of the target is 99% or more.
4) The magnetic material sputtering target according to any one of 1) to 3) above, wherein the target comprises a surface finished by surface grinding.
5) A method for producing a magnetic material sputtering target, wherein a raw material powder of a magnetic material target having a B content of 17 at % or more and 40 at % or less, and remainder being one or more elements selected from Co and Fe, is prepared via a gas atomization method, the gas atomized raw material powder is sintered to obtain a target, the target has a structure including a B-rich phase and a B-poor phase, and a number of the B-rich phases in which a maximum inscribed circle having a diameter of 15 µm or more can be drawn is one or less.

6) The method for producing a magnetic material sputtering target according to 5) above, wherein a gas atomized powder having a grain size of 300 µm or less is used as the raw material powder.

7) The method for producing a magnetic material sputtering target according to 5) or 6) above, wherein sintering is performed at a sintering temperature of 900 to 1240° C.

8) The method for producing a magnetic material sputtering target according to any one of 5) to 7) above, wherein surface finishing of the target is performed via surface grinding.

9) The method for producing a magnetic material sputtering target according to any one of 5) to 8) above, wherein the target contains one or more elements selected from Al, Cr, Cu, Hf, Mn, Ni, Ru, Si, Ta, and W in an amount of 0.5 at % or more and 20 at % or less.

10) The method for producing a magnetic material sputtering target according to any one of 5) to 9) above, wherein sintering is performed so that a density of the target becomes 99% or more.

The B-rich phase is finely dispersed in the magnetic material sputtering target of the present invention, and the machinability of the target is thereby improved. Moreover, significant effects are yielded in that the generation of particles is inhibited and the yield in the production of thin films is improved when the target is used for sputtering with a magnetron sputtering equipment comprising a DC power supply.

BRIEF DESCRIPTION OF DRAWINGS

FIG. 1 This is a diagram showing the structural image of a representative target (Fe-20Co-40B).

FIG. 2 This is a diagram showing a B-rich (portion where the concentration is high) phase and a B-poor (portion where the concentration is low) phase, obtained by analyzing the B concentration in the structural image of FIG. 1 with an electron probe microanalyzer (EPMA), and then converting the FIG. 1 to black and white.

DETAILED DESCRIPTION

The magnetic material sputtering target of the present invention is produced from a sintered compact having a B content of 17 at % or more and 40 at % or less, and remainder being one or more elements selected from Co and Fe. Upon performing sintering, [a] gas atomized powders of B and Co and/or Fe are prepared and sintered to obtain a magnetic material sputtering target. Basically, the target is of a Co—B-based, a Fe—B-based, or a Co—Fe—B-based material.

If the B content is less than 17 at %, it is not possible to yield the characteristics as the magnetic material target of the present invention. Moreover, the same applies to cases where the B content exceeds 40 at %, and when too much B is contained, the brittleness increases and the strength deteriorates, and there is a drawback in that the target becomes susceptible to cracks. Accordingly, the B content is preferably 17 at % or more and 40 at % or less.

The structure of the target is configured from Co, Fe, or Co—Fe as the main component, and the alloy of such main component and B, and there are two phases (two types) of alloy phases containing B in the target structure. These phases are, as described above, a B-rich (portion where the concentration is high) alloy phase and a B-poor (portion where the concentration is low) alloy phase, and exist in a state of being mutually dispersed. The difference between these phases can be confirmed by observing the structure. A representative example of this structure is shown in FIG. 1. The phases can be differentiated by referring to the B concentration distribution in FIG. 2. In other words, as shown with the lead line (arrow) on the black-and-white structural image of FIG. 2, the light (whitish) area is the B-rich phase, and the dark area is the B-poor phase.

As shown in FIG. 1, while both a B-rich phase and a B-poor phase can be observed, the shapes of these phases are indefinite. One major feature of the present invention is that the target includes a B-rich phase and a B-poor phase, and the number of B-rich phases in which a maximum inscribed circle having a diameter of 15 µm or more can be drawn is one or less. With regard to this B-rich phase, the diameter of the maximum inscribed circle can be checked by polishing the target, and observing a microscopic field in a range of 0.01 $mm^2$ (range of 0.1 mm×0.1 mm; hereinafter the same) of the polished surface.

The B-rich phase strongly influences the characteristics of the sintered compact target. When this B-rich phase becomes large without being dispersed, the machinability of the target becomes inferior, and it causes the generation of particles during sputtering to increase. While the B-poor phase has a similar structure as the B-rich phase, the B-poor phase has limited influence on the generation of particles since the B concentration is low, but it is desirable for the B-poor phase to possess dispersibility as with the B-rich phase in order to obtain a target structure having favorable uniformity.

Accordingly, in order to stabilize the properties of the target, it is effective to finely disperse the B-rich phase. The dispersibility of the B-rich phase can be evaluated by causing the diameter of the maximum inscribed circle that can be drawn in the B-rich phase to be less than 15 µm.

This is because, when the B-rich phase is particularly refined, the target structure also becomes refined, and this kind of refinement is possible with the present invention. In addition, when the refinement of the structure is demanded, it can be said that it would be desirable to cause the diameter of the maximum inscribed circle that can be drawn in the B-rich phase to be 10 µm or less.

Nevertheless, a uniform structure cannot be constantly obtained with a sintered compact target, and there are rare cases where the diameter of the maximum inscribed circle that can be drawn in the B-rich phase is 15 µm or more. Accordingly, if the B-rich phase in a microscopic field in a range of 0.01 $mm^2$ is observed and the number of B-rich phases in which a maximum inscribed circle having a diameter of 15 µm or more can be drawn is one or less, it is possible to attain the object of the present invention, and stable target properties for sputtering can be obtained.

It is thereby possible to improve the machinability of the target, and effectively inhibit the generation of particles when performing sputtering with a magnetron sputtering equipment comprising a DC power supply.

In the present invention, the lower the oxygen content in the target, the better. If the oxygen content increases, the number of particles that are generated during sputtering tends to increase. This is considered to be because boron oxide is formed by reacting B and oxygen during the sintering process and the hygroscopicity possessed by boron oxide affects the sputtering.

As the sintered compact raw material powder used in the present invention, normally used is a powder that is produced based on the gas atomization method. Since a powder produced based on gas atomization will have a lower oxygen content in comparison with a powder produced based on water atomization or a mechanically pulverized powder, a gas atomized powder is desirably used. The oxygen content in the target when using a gas atomized powder is 900 ppm or less, depending on the composition and conditions.

Nevertheless, upon producing the magnetic material sputtering target of the present invention, it is also possible to sinter a sintered compact raw material powder (pulverized powder of individual raw materials) other than an atomized powder. In the foregoing case, the oxygen content is desirably within the foregoing range; that is, 900 ppm or less. Moreover, in the foregoing case, if the grain size of the sintering powder is large, it becomes difficult to increase the density. Meanwhile, if the pulverized raw material powder is excessively refined, the oxygen content will increase. Thus, it is desirable to use a powder having an average grain size of 50 to 300 μm.

In the present invention, the basic invention is a magnetic material sputtering target produced from a sintered compact having a B content of 17 at % or more and 40 at % or less, and remainder being one or more elements selected from Co and Fe, but it also possible to contain one or more elements selected from Al, Cr, Cu, Hf, Mn, Ni, Ru, Si, Ta, and W in an amount of 0.5 at % or more and 20 at % or less in order to further improve the magnetic properties.

Since this amount of additive elements is a small amount compared to the overall component composition of the magnetic material sputtering target, no problems will arise regarding the target structure. Moreover, the addition of these additive elements will not affect the machinability or generation of particles. If the additive amount is less than 0.5 at %, there is no effect in adding these elements, and if the additive amount exceeds 20 at %, the structure of the present invention cannot be maintained. Thus, the amount of these additive elements should be within the foregoing range.

Moreover, by suitably adjusting the sintering conditions, it is possible to obtain a magnetic material sputtering target of which density is 99% or more.

Note that the relative density is a value obtained by dividing the measured density of the sputtering target by the calculated density (also referred to as the logical density). The calculated density is the density when it is assumed that the constituents of the target coexist without being mutually dispersed or mutually reacting, and is obtained according to the following formula.

calculated density=Σ(molecular weight of constituents×molar ratio of constituents)/Σ(molecular weight of constituents×molar ratio of constituents/literature data density of constituents)

Here, Σ implies taking on the sum of all constituents of the target. Note that the measured density of the sputtering target is determined in the Archimedes method.

The method for producing the target of the present invention is now explained.

Upon producing the magnetic material sputtering target of the present invention, a raw material powder having a B content of 17 at % or more and 40 at % or less, and remainder being one or more elements selected from Co and Fe, is produced in advance based on the gas atomization method.

Subsequently, the gas atomized raw material powder is sintered, the sintered material (sintered compact) is molded into a target shape, and the surface thereof is additionally polished to obtain a target. It can be realized thereby that the structure observed on the polished surface of the target is a structure configured from two phases, the B-rich phase and the B-poor phase, being mutually dispersed, and, in the observation of the B-rich phase in a microscopic field in a range of 0.01 mm$^2$, the number of B-rich phases in which a maximum inscribed circle having a diameter of 15 μm or more can be drawn is one or less.

As the raw material powder, it is desirable to use a gas atomized powder having a grain size of 300 μm or less. This is because, since it allows easy sintering, relatively low temperature sintering conditions can be adopted, and this is effective in inhibiting the deterioration in the dispersibility of the phases existing in the target structure.

Moreover, sintering is desirably performed at a sintering temperature of 900 to 1240° C. When sintering is performed within the foregoing temperature range after adjusting the component composition, it is effective for the dispersion of the phases. If the sintering is performed at a temperature of less than 900°, the sintering becomes insufficient. Meanwhile, if the sintering is performed at a temperature exceeding 1240° C., the phases tend to become coarsened. Thus, it can be said that the sintering temperature is desirably set to be within the foregoing range.

The target is subject to surface finishing, and the target surface is desirably subject to surface grinding in order to improve the smoothness of the target surface. Nevertheless, other surface finishing processes may also be used so as long as a similar smooth surface can be obtained.

(Specific Example of Sintering Conditions and Processing Conditions of Target)

A specific example of the sintering conditions for producing the magnetic material sputtering target of the present invention is now explained. The following sintering conditions and the processing conditions of the target merely illustrate the preferred conditions, and other conditions may be arbitrarily added or these conditions may be arbitrarily changed as needed.

The composition of 40Fe-40Co-20B is explained as a representative example. The raw material can be obtained by weighing the contents of Fe, Co and B to attain 40Fe-40Co-20B, subjecting it to the gas atomization method, and sieving the gas-atomized powder.

When sieving the raw material powder, the powder is desirably sieved to obtain a grain size of 50 to 300 μm. Moreover, it is also possible to prepare two or more types of gas atomized powders having different compositions. For example, the blending ratio of 45Fe-40Co-15B and 35Fe-40Co-25B may be adjusted, and these powders may be mixed. What is important in this operation is that, by using a gas atomized powder, the raw material powder will have a low oxygen, and, by causing the grain size of the raw material powder to be uniform, it is possible to increase the sinterability and stably produce a high density target.

Next, the 40Fe-40Co-20B gas atomized powder is molded and sintered using a vacuum hot press device under the following conditions; namely, temperature of 950° C., holding time of 3 hours, and pressure of 30 MPa, in order to obtain a sintered compact. The molding and sintering process is not limited to the hot press method, and a plasma discharge sintering method or a hot isostatic sintering method may also be used.

These sintering conditions (sintering temperature, holding time, pressure, atmosphere) may be arbitrarily adjusted depending on the material to be sintered. In other words, these sintering conditions may be suitably selected in line with the object of obtaining the characteristics of the magnetic material sputtering target of the present invention.

The holding temperature during sintering is preferably set to a low temperature within the temperature range in which the target can be sufficiently densified. While this will also depend on the composition of the target, the holding temperature is within a range of 900 to 1240° C. when the B composition of the target falls within the B composition range of the Fe—Co—B-based target of the present invention. When the holding time is long at a high sintering temperature, this is advantageous for achieving high densification, but the grains will grow and cause the B-rich phase to become enlarged, and therefore, it is extremely important to optimize the sintering conditions.

Next, the sintered compact is machined to obtain a disk-shaped target having a diameter of 180 mm and a thickness of 5 mm. For the machining process, a lathe may be initially used, but the finished surface will be rough, and therefore, it is desirable to perform the surface grinding process for finishing off the target surface, and the surface may be additionally polished for the final finish. Moreover, in the surface grinding process, depending on the direction of the grinding wheel spindle, there are cases of performing grinding with the side face of a cylindrical grindstone, and cases of performing grinding with the cylindrical face of a cylindrical grindstone. Grinding based on the side face of the grindstone is desirable since a better finished surface can be obtained in terms of roughness and dimensional accuracy.

50 to 300 µm, and this raw material was hot pressed at 1190° C.×3 hours to produce a sintered compact having a composition of 40Fe-20Co-40B in terms of a molar ratio.

The density of the obtained sintered compact was 99% or more. In addition, the sintered compact was subject to cutting work with a lathe and finished off with a surface grinding process to obtain a disk-shaped target having a diameter of 180 mm and a thickness of 5 mm.

Moreover, the structure observed on the polished surface of the target included a B-rich phase and a B-poor phase as with FIG. 1, the diameter of the maximum inscribed circle that can be drawn in the B-rich phase was 15 µm or less, and the number of B-rich phases in which a maximum inscribed circle having a diameter of 15 µm or more can be drawn was only one in the observation of a microscopic field in a range of 0.01 mm² (area of 0.1 mm×0.1 mm; hereinafter the same).

Subsequently, thus produced magnetic material sputtering target was sputtered. The sputtering conditions were set as follows; namely, sputter power of 1.0 kW and Ar gas pressure of 1.7 Pa; and sputtering was performed so as to attain an intended film thickness of 1000 nm on a 4-inch Si wafer at the time of discharge of 1 kWh. In addition, the number of particles adhered onto the wafer was measured using Surfscan. It was possible to suppress the number of particles to 12 particles. The foregoing results are shown in Table 1.

TABLE 1

| | Composition (mol %) | Raw Material | Sintering Conditions | | Density | Number of inscribed circles having a diameter of 15 µm or more that can be drawn in a B-rich phase | Number of Particles |
|---|---|---|---|---|---|---|---|
| Example 1 | 40Fe—20Co—40B | Gas atomized powder | 1190° C. | 3 hours | 99% or higher | 1 | 12 |
| Example 2 | 62Fe—18Co—20B | Gas atomized powder | 950° C. | 3 hours | 99% or higher | 0 | 9 |
| Example 3 | 71Co—3Fe—26B | Gas atomized powder | 1050° C. | 3 hours | 99% or higher | 1 | 10 |
| Example 4 | 70Fe—30B | Gas atomized powder | 1090° C. | 3 hours | 99% or higher | 1 | 11 |
| Example 5 | 42Co—20Fe—20B—18Si | Gas atomized powder | 950° C. | 3 hours | 99% or higher | 1 | 9 |
| Example 6 | 50Co—20Co—18B—12Ta | Gas atomized powder | 950° C. | 3 hours | 99% or higher | 0 | 12 |
| Comparative Example 1 | 40Fe—20Co—40B | Gas atomized powder | 1250° C. | 4 hours | 99% or higher | 11 | 25 |
| Comparative Example 2 | 62Fe—18Co—20B | Co, Fe gas atomized powder; B pulverized powder | 1050° C. | 3 hours | 99% or higher | 50 or more | 50 or more |
| Comparative Example 3 | 69Co—5Fe—26B | Gas atomized powder | 1120° C. | 3 hours | 99% or higher | 4 | 19 |
| Comparative Example 4 | 70Fe—30B | Pulverized powder | 900° C. | 3 hours | 97% | 50 or more | 50 or more |
| Comparative Example 5 | 42Co—20Fe—20B—18Si | Co, Fe gas atomized powder; B, Si pulverized powder | 950° C. | 3 hours | 99% or higher | 50 or more | 50 or more |
| Comparative Example 6 | 50Co—20Fe—18B—12Ta | Co, Fe gas atomized powder; B, Ta pulverized powder | 950° C. | 3 hours | 99% or higher | 50 or more | 50 or more |

EXAMPLES

The present invention is now explained in detail with reference to the Examples and Comparative Examples. Note that these Examples are merely illustrative, and the present invention shall in no way be limited thereby. In other words, various modifications and other embodiments are covered by the present invention, and the present invention is limited only by the scope of its claims.

Example 1

A gas atomized powder having a composition of 40Fe-20Co-40B was prepared and adjusted to have a grain size of Example 2

A gas atomized powder having a composition of 62Fe-18Co-20B was prepared and adjusted to have a grain size of 50 to 300 µm, and this raw material was hot pressed at 950° C.×3 hours to produce a sintered compact having a composition of 62Fe-18Co-20B in terms of a molar ratio. The density of the obtained sintered compact was 99% or more.

In addition, the sintered compact was processed with a lathe and finished off with a surface grinding process to obtain a disk-shaped target having a diameter of 180 mm and a thickness of 5 mm.

Moreover, the structure observed on the polished surface of the target included a B-rich phase and a B-poor phase as with FIG. 1, the diameter of the maximum inscribed circle that can be drawn in the B-rich phase was 15 µm or less, and the number of B-rich phases in which a maximum inscribed circle having a diameter of 15 µm or more can be drawn was zero in the observation of a microscopic field in a range of 0.01 mm².

Subsequently, thus produced magnetic material sputtering target was sputtered based on the same sputtering conditions as Example 1, and it was possible to suppress the number of particles to 9 particles at the time of discharge of 1 kwh. The foregoing results are shown in Table 1.

Example 3

A gas atomized powder having a composition of 71Co-3Fe-26B was prepared and adjusted to have a grain size of 50 to 300 µm, and this raw material was hot pressed at 1050° C.×3 hours to produce a sintered compact having a composition of 71Co-3Fe-26B in terms of a molar ratio. The density of the obtained sintered compact was 99% or more.

In addition, the sintered compact was processed with a lathe and finished off with a surface grinding process to obtain a disk-shaped target having a diameter of 180 mm and a thickness of 5 mm.

Moreover, the structure observed on the polished surface of the target included a B-rich phase and a B-poor phase as with FIG. 1, the diameter of the maximum inscribed circle that can be drawn in the B-rich phase was 15 µm or less, and the number of B-rich phases in which a maximum inscribed circle having a diameter of 15 µm or more can be drawn was only one in the observation of a microscopic field in a range of 0.01 mm².

Subsequently, thus produced magnetic material sputtering target was sputtered based on the same sputtering conditions as Example 1, and it was possible to suppress the number of particles to 10 particles at the time of discharge of 1 kwh. The foregoing results are shown in Table 1.

Example 4

A gas atomized powder having a composition of 70Fe-30B was prepared and adjusted to have a grain size of 50 to 300 µm, and this raw material was hot pressed at 1090° C.×3 hours to produce a sintered compact having a composition of 70Fe-30B in terms of a molar ratio. The density of the obtained sintered compact was 99% or more.

In addition, the sintered compact was processed with a lathe and finished off with a surface grinding process to obtain a disk-shaped target having a diameter of 180 mm and a thickness of 5 mm.

Moreover, the structure observed on the polished surface of the target included a B-rich phase and a B-poor phase as with FIG. 1, the diameter of the maximum inscribed circle that can be drawn in the B-rich phase was 15 µm or less, and the number of B-rich phases in which a maximum inscribed circle having a diameter of 15 µm or more can be drawn was only one in the observation of a microscopic field in a range of 0.01 mm².

Subsequently, thus produced magnetic material sputtering target was sputtered based on the same sputtering conditions as Example 1, and it was possible to suppress the number of particles to 11 particles at the time of discharge of 1 kwh. The foregoing results are shown in Table 1.

Example 5

A gas atomized powder having a composition of 42Co-20Fe-20B-18Si was prepared and adjusted to have a grain size of 50 to 300 µm, and this raw material was hot pressed at 950° C.×3 hours to produce a sintered compact having a composition of 42Co-20Fe-20B-18Si in terms of a molar ratio. The density of the obtained sintered compact was 99% or more.

In addition, the sintered compact was processed with a lathe and finished off with a surface grinding process to obtain a disk-shaped target having a diameter of 180 mm and a thickness of 5 mm.

Moreover, the structure observed on the polished surface of the target included a B-rich phase and a B-poor phase as with FIG. 1, the diameter of the maximum inscribed circle that can be drawn in the B-rich phase was 15 µm or less, and the number of B-rich phases in which a maximum inscribed circle having a diameter of 15 µm or more can be drawn was only one in the observation of a microscopic field in a range of 0.01 mm².

Subsequently, thus produced magnetic material sputtering target was sputtered based on the same sputtering conditions as Example 1, and it was possible to suppress the number of particles to 9 particles at the time of discharge of 1 kwh. The foregoing results are shown in Table 1.

Example 6

A gas atomized powder having a composition of 50Fe-20Co-18B-12Ta was prepared and adjusted to have a grain size of 50 to 300 µm, and this raw material was hot pressed at 950° C.×3 hours to produce a sintered compact having a composition of 50Fe-20Co-18B-12Ta in terms of a molar ratio. The density of the obtained sintered compact was 99% or more.

In addition, the sintered compact was processed with a lathe and finished off with a surface grinding process to obtain a disk-shaped target having a diameter of 180 mm and a thickness of 5 mm.

Moreover, the structure observed on the polished surface of the target included a B-rich phase and a B-poor phase as with FIG. 1, the diameter of the maximum inscribed circle that can be drawn in the B-rich phase was 15 µm or less, and the number of B-rich phases in which a maximum inscribed circle having a diameter of 15 µm or more can be drawn was zero in the observation of a microscopic field in a range of 0.01 mm².

Subsequently, thus produced magnetic material sputtering target was sputtered based on the same sputtering conditions as Example 1, and it was possible to suppress the number of particles to 12 particles at the time of discharge of 1 kwh. The foregoing results are shown in Table 1.

Comparative Example 1

A gas atomized powder having a composition of 40Fe-20Co-40B was prepared and adjusted to have a grain size of 200 to 400 µm, and this raw material was hot pressed at 1250° C.×4 hours to produce a sintered compact having a composition of 40Fe-20Co-40B in terms of a molar ratio.

The density of the obtained sintered compact was 99% or more. In addition, the sintered compact was subject to cutting work with a lathe and finished off with surface grinding to obtain a disk-shaped target having a diameter of 180 mm and a thickness of 5 mm.

Moreover, the structure observed on the polished surface of the target included a B-rich phase and a B-poor phase, but unlike FIG. 1, the number of B-rich phases in which a maximum inscribed circle having a diameter of 15 µm or more can be drawn was eleven in the observation of a microscopic field in a range of 0.01 mm². When thus produced magnetic material sputtering target was sputtered, the number of particles increased to 25 particles.

The increase in particles is considered to be because the B-rich phase became enlarged due to the grain size of the raw material powder being too large, and the hot press temperature being too high at 1250° C.

Comparative Example 2

A mixed powder obtained by mixing a Co gas atomized powder, an Fe gas atomized powder, and a B pulverized powder, all adjusted to have a grain size of 50 to 300 μm, was used as a raw material powder and hot pressed at 1050° C.×3 hours to produce a sintered compact having a composition of 62Fe-18Co-20B in terms of a molar ratio.

The density of the obtained sintered compact was 99% or more. In addition, the sintered compact was processed with a lathe and finished off with a surface grinding process to obtain a disk-shaped target having a diameter of 180 mm and a thickness of 5 mm.

Moreover, with the structure observed on the polished surface of the target, unlike FIG. 1, the differentiation between the B-rich phase and the B-poor phase was unclear, and most of the maximum inscribed circles in the B phase had a diameter of 15 μm or more. When thus produced magnetic material sputtering target was sputtered, the number of particles increased to 50 or more particles.

The increase in particles is considered to be because the differentiation between the B-rich phase and the B-poor phase consequently became unclear due to the use of a pulverized powder as the B powder.

Comparative Example 3

A gas atomized powder having a composition of 69Co-5Fe-26B was prepared and pulverized to adjust the powder to have a grain size of 200 to 400 μm, and this raw material was hot pressed at 1120° C.×3 hours to produce a sintered compact having a composition of 69Co-5Fe-26B in terms of a molar ratio.

The density of the obtained sintered compact was 99% or more. In addition, the sintered compact was processed with a lathe and finished off with a surface grinding process to obtain a disk-shaped target having a diameter of 180 mm and a thickness of 5 mm.

Moreover, the structure observed on the polished surface of the target included a B-rich phase and a B-poor phase, but unlike FIG. 1, the number of B-rich phases in which a maximum inscribed circle having a diameter of 15 μm or more can be drawn was four in the observation of a microscopic field in a range of 0.01 mm². When thus produced magnetic material sputtering target was sputtered, the number of particles increased to 19 particles.

The increase in particles is considered to be because there were numerous B-rich phases in which a maximum inscribed circle having a diameter of 15 μm or more can be drawn due to the large grain size of the atomized powder.

Comparative Example 4

A powder (non-gas atomized powder) having a composition of 70Fe-30B was prepared and adjusted to have a grain size of 200 to 400 μm, and this raw material was hot pressed at 900° C.×3 hours to produce a sintered compact having a composition of 70Fe-30B in terms of a molar ratio. The density of the obtained sintered compact was 97%. In addition, the sintered compact was processed with a lathe and finished off with a surface grinding process to obtain a disk-shaped target having a diameter of 180 mm and a thickness of 5 mm.

Moreover, the structure observed on the polished surface of the target included a B-rich phase and a B-poor phase as with FIG. 1, but the number of B-rich phases in which a maximum inscribed circle having a diameter of 15 μm or more can be drawn was fifty or more in the observation of a microscopic field in a range of 0.01 mm². Moreover, the oxygen content was 1560 wtppm.

When thus produced magnetic material sputtering target was sputtered based on the same sputtering conditions as Example 1, the number of particles increased to 50 or more particles at the time of discharge of 1 kwh. The foregoing results are shown in Table 1. The increase in particles is considered to be because the oxygen content increased and the density was insufficient due to the raw material being a non-gas atomized powder.

Comparative Example 5

A mixed powder obtained by mixing a Co gas atomized powder, an Fe gas atomized powder, a B pulverized powder, and a Si powder, all adjusted to have a grain size of 50 to 300 μm, was used as a raw material powder and hot pressed at 950° C.×3 hours to produce a sintered compact having a composition of 42Co-20Fe-20B-18Si in terms of a molar ratio.

The density of the obtained sintered compact was 99% or more. In addition, the sintered compact was processed with a lathe and finished off with a surface grinding process to obtain a disk-shaped target having a diameter of 180 mm and a thickness of 5 mm.

Moreover, with the structure observed on the polished surface of the target, unlike FIG. 1, the differentiation between the B-rich phase and the B-poor phase was unclear, and most of the maximum inscribed circles in the B phase had a diameter of 15 μm or more. When thus produced magnetic material sputtering target was sputtered, the number of particles increased to 50 or more particles.

The increase in particles is considered to be because, instead of a gas atomized powder, a pulverized powder was used as the B powder, the B-containing phase consequently became coarse, and the differentiation between the B-rich phase and the B-poor phase consequently became unclear.

Comparative Example 6

A mixed powder obtained by mixing a Co gas atomized powder, an Fe gas atomized powder, a B pulverized powder, and a Ta powder, all adjusted to have a grain size of 50 to 300 μm, was used as a raw material powder and hot pressed at 950° C.×3 hours to produce a sintered compact having a composition of 50Co-20Fe-18B-12Ta in terms of a molar ratio.

The density of the obtained sintered compact was 99% or more. In addition, the sintered compact was processed with a lathe and finished off with a surface grinding process to obtain a disk-shaped target having a diameter of 180 mm and a thickness of 5 mm.

Moreover, with the structure observed on the polished surface of the target, unlike FIG. 1, the differentiation between the B-rich phase and the B-poor phase was unclear, and most of the maximum inscribed circles in the B phase had a diameter of 15 μm or more. When thus produced magnetic material sputtering target was sputtered, the number of particles increased to 50 or more particles.

The increase in particles is considered to be because, instead of a gas atomized powder, a pulverized powder was used as the B powder, the B-containing phase consequently became coarse, and the differentiation between the B-rich phase and the B-poor phase consequently became unclear.

Based on the comparison of the foregoing Examples and Comparative Examples, the magnetic material sputtering target of the present invention needs to be produced from a sintered compact having a B content of 17 at % or more and 40 at % or less, and remainder being one or more elements selected from Co and Fe, and it is necessary and important that the structure observed on the polished surface of the target includes a B-rich phase and a B-poor phase, and the number of the B-rich phases in which a maximum inscribed circle having a diameter exceeding 15 µm can be drawn is one or less in the observation of a microscopic field in a range of 0.01 mm$^2$.

It is thereby possible to improve the machinability of the target and inhibit the generation of particles. In the examples where one or more elements selected from Al, Cr, Cu, Mn, Nb, Ni, Ru, Si, Ta, W, Zr, and Hf are contained in an amount of 0.5 at % or more and 20 at % or less, while only the examples of containing Si and Ta were illustrated, it has been confirmed in the experiments that the other additive elements are able to obtain the same results as the foregoing Examples by going through the same target production process as the Examples.

The B-rich phase is finely dispersed in the magnetic material sputtering target of the present invention, and the machinability of the target is consequently improved. Moreover, significant effects are yielded in that the generation of particles is inhibited and the yield in the production of thin films is improved when the target is used for sputtering with a magnetron sputtering equipment comprising a DC power supply. The present invention is useful as a sputtering target for depositing films used in magnetic heads and MRAMs, as well as other magnetic films.

The invention claimed is:

1. A magnetic material sputtering target made of a sintered compact consisting of B in a content of 26 at % or more and 40 at % or less and remainder being one or more elements selected from the group consisting of Co and Fe, wherein the target has a structure comprising a B-rich alloy phase containing B and a B-poor alloy phase containing B, wherein a volume ratio of the B-rich alloy phase is greater than a volume ratio of the B-poor alloy phase, and wherein the B-rich alloy phase having a size such that, in an area of 0.01 mm$^2$ of a cross-sectional face or sputtering face of the sputtering target, a number of particles of the B-rich alloy phase within which a maximum inscribed circle having a diameter of 15 µm or more is able to be drawn is one or less.

2. A magnetic material sputtering target made of a sintered compact consisting of B in a content of 26 at % or more and 40 at % or less, one or more elements selected from the group consisting of Al, Cr, Cu, Hf, Mn, Ni, Ru, Si, Ta, and W in a total amount of 0.5 at % or more and 20 at % or less, and remainder being one or more elements selected from the group consisting of Co and Fe, wherein the target has a structure comprising a B-rich alloy phase containing B and a B-poor alloy phase containing B, wherein a volume ratio of the B-rich alloy phase is greater than a volume ratio of the B-poor alloy phase, and wherein the B-rich alloy phase having a size such that, in an area of 0.01 mm$^2$ of a cross-sectional face or sputtering face of the sputtering target, a number of particles of the B-rich alloy phase within which a maximum inscribed circle having a diameter of 15 µm or more is able to be drawn is one or less.

3. The magnetic material sputtering target according to claim 2, wherein a density of the target is 99% or more.

4. The magnetic material sputtering target according to claim 3, wherein the target comprises a surface finished by surface grinding.

5. A method for producing a magnetic material sputtering target, wherein a raw material powder having a grain size of 300 µm or less and comprising B in a content of 26 at % or more and 40 at % or less and one or more elements selected from the group consisting of Co and Fe is prepared by a gas atomization method, and then the gas atomized raw material powder is sintered to obtain a sintered body for forming the magnetic material sputtering target by machine processing and mechanical surface finishing, the target having a structure which comprises a B-rich alloy phase containing B and a B-poor alloy phase containing B, a volume ratio of the B-rich alloy phase being greater than a volume ratio of the B-poor alloy phase, and the B-rich alloy phase having a size such that, in an area of 0.01 mm$^2$ of a cross-sectional face or sputtering face of the sputtering target, a number of particles of the B-rich alloy phase within which a maximum inscribed circle having a diameter of 15 µm or more is able to be drawn is one or less.

6. The method for producing a magnetic material sputtering target according to claim 5, wherein the sintering is performed at a sintering temperature of 900 to 1240° C.

7. The method for producing a magnetic material sputtering target according to claim 6, wherein the surface finishing is performed via surface grinding.

8. The method for producing a magnetic material sputtering target according to claim 7, wherein the target further contains one or more elements selected from the group consisting of Al, Cr, Cu, Hf, Mn, Ni, Ru, Si, Ta, and W in a total amount of 0.5 at % or more and 20 at % or less.

9. The method for producing a magnetic material sputtering target according to claim 8, wherein the structure of the target is characterized in having a density of 99% or more.

10. The method for producing a magnetic material sputtering target according to claim 5, wherein the surface finishing is performed via surface grinding.

11. The method for producing a magnetic material sputtering target according to claim 5, wherein the target further contains one or more elements selected from the group consisting of Al, Cr, Cu, Hf, Mn, Ni, Ru, Si, Ta, and W in a total amount of 0.5 at % or more and 20 at % or less.

12. The method for producing a magnetic material sputtering target according to claim 5, wherein the structure of the target is characterized in having a density of 99% or more.

13. The magnetic material sputtering target according to claim 1, wherein a density of the target is 99% or more.

14. The magnetic material sputtering target according to claim 1, wherein the target comprises a surface finished by surface grinding.

15. The method for producing a magnetic material sputtering target according to claim 5, wherein the raw material powder consists of B in a content of 26 at % or more and 40 at % or less and one or more elements selected from the group consisting of Co and Fe.

16. The method for producing a magnetic material sputtering target according to claim 5, wherein the raw material powder consists of B in a content of 26 at % or more and 40 at % or less, one or more elements selected from the group consisting of Al, Cr, Cu, Hf, Mn, Ni, Ru, Si, Ta, and W in a total amount of 0.5 at % or more and 20 at % or less, and one or more elements selected from the group consisting of Co and Fe.

* * * * *